(12) United States Patent
Tu (10) Patent No.: US 10,684,400 B2
(45) Date of Patent: Jun. 16, 2020

(54) OPTICAL ELEMENTS AND METHOD FOR FABRICATING THE SAME

(71) Applicant: VisEra Technologies Company Limited, Hsin-Chu (TW)

(72) Inventor: Zong-Ru Tu, Zhubei (TW)

(73) Assignee: VisEra Technologies Company Limited, Hsin-Chu (TW)

( * ) Notice: Subject to any disclaimer, the term of this patent is extended or adjusted under 35 U.S.C. 154(b) by 190 days.

(21) Appl. No.: 16/054,423

(22) Filed: Aug. 3, 2018

(65) Prior Publication Data

US 2020/0041705 A1 Feb. 6, 2020

(51) Int. Cl.
*G02B 5/20* (2006.01)
*G03F 7/00* (2006.01)
*G02B 5/30* (2006.01)

(52) U.S. Cl.
CPC ........... *G02B 5/201* (2013.01); *G03F 7/0007* (2013.01); *G02B 5/305* (2013.01); *G02B 5/3058* (2013.01)

(58) Field of Classification Search
CPC .............................. G02B 5/201; G03F 7/0007
USPC .......................................................... 359/885
See application file for complete search history.

(56) References Cited

U.S. PATENT DOCUMENTS

| | | | | |
|---|---|---|---|---|
| 9,293,488 | B2 * | 3/2016 | Tu ..................... | H01L 27/14625 |
| 9,502,453 | B2 * | 11/2016 | Tu ..................... | H01L 27/14627 |
| 10,475,847 | B2 * | 11/2019 | Lu ..................... | H01L 21/32051 |
| 10,566,365 | B2 * | 2/2020 | Chen ................. | H01L 27/14623 |
| 2014/0339606 | A1 * | 11/2014 | Lin .................... | H01L 27/14685 |
| | | | | 257/228 |
| 2015/0270298 | A1 * | 9/2015 | Lin .................... | H01L 27/14627 |
| | | | | 257/432 |
| 2016/0141321 | A1 | 5/2016 | Hsieh et al. | |
| 2017/0077163 | A1 * | 3/2017 | Chou ................. | H01L 27/14627 |
| 2017/0278893 | A1 * | 9/2017 | Cheng ................ | H01L 27/1463 |
| 2020/0041775 | A1 * | 2/2020 | Tu ..................... | G02B 19/0009 |

FOREIGN PATENT DOCUMENTS

| | | | |
|---|---|---|---|
| JP | 2008116522 | A | 5/2008 |
| JP | 2013030666 | A | 2/2013 |
| JP | 2013254610 | A | 12/2013 |
| JP | 2014225667 | A | 12/2014 |
| JP | 2015185844 | A | 10/2015 |
| JP | 2012227478 | A | 11/2015 |
| JP | 2016046510 | A | 4/2016 |
| JP | 2016225584 | A | 12/2016 |
| WO | WO 2018020846 | A1 | 2/2018 |

OTHER PUBLICATIONS

Japanese Office Action Based on Patent Application No. 2018-216558; dated Dec. 10, 2019.

* cited by examiner

*Primary Examiner* — Ricky D Shafer
(74) *Attorney, Agent, or Firm* — Muncy, Geissler, Olds & Lowe, P.C.

(57) ABSTRACT

An optical element is provided. The optical element includes a substrate, a plurality of metal grids formed on the substrate, a patterned first organic layer formed on the plurality of metal grids, a color filter surrounded by the patterned first organic layer, a second organic layer formed on the patterned first organic layer and the color filter, and a light collection layer surrounded by the second organic layer and corresponding to the color filter. The refractive index of the light collection layer is greater than that of the second organic layer. A method for fabricating the optical element is also provided.

20 Claims, 10 Drawing Sheets

OPTICAL ELEMENTS AND METHOD FOR FABRICATING THE SAME

BACKGROUND OF THE INVENTION

Field of the Invention

The invention relates to an optical element, and more particularly to an optical element with a light collection layer formed above color filters and a fabrication method thereof.

Description of the Related Art

In an optical element with a composite metal grid (CMG)-type structure, a microlens is required above the color filters. In an optical element with a wave guide color filter (WGCF)-type structure, a low-refractive-index material surrounding the color filters is used instead of the microlens to form a wave guide structure.

However, in an optical element with a wave guide color filter (WGCF)-type structure, due to lack of light from neighboring pixels, the QE peak of the current pixel is dropped, especially for a blue (B) color filter.

Therefore, development of an optical element with a wave guide color filter (WGCF)-type structure capable of improving the QE spectrum, especially for a blue (B) color filter, and keeping low cross-talk between color filters is desirable.

BRIEF SUMMARY OF THE INVENTION

In accordance with one embodiment of the invention, an optical element is provided. The optical element includes a substrate, a plurality of metal grids, a patterned first organic layer, a color filter, a second organic layer and a light collection layer. The plurality of metal grids are formed on the substrate. The patterned first organic layer is formed on the plurality of metal grids. The color filter is surrounded by the patterned first organic layer. The second organic layer is formed on the patterned first organic layer and the color filter. The light collection layer is surrounded by the second organic layer and corresponds to the color filter. The refractive index of the light collection layer is greater than that of the second organic layer.

In some embodiments, the patterned first organic layer has a refractive index which is in a range from about 1.2 to about 1.45.

In some embodiments, the color filter is a blue color filter.

In some embodiments, the color filter comprises a red color filter, a green color filter or a blue color filter.

In some embodiments, the refractive index of the light collection layer is greater than that of the color filter.

In some embodiments, the refractive index of the light collection layer is in a range from about 1.6 to about 1.9.

In some embodiments, the light collection layer is exposed from the second organic layer.

In some embodiments, the light collection layer is further covered by the second organic layer.

In some embodiments, the second organic layer above the light collection layer has a thickness which is less than or equal to about 50 nm.

In some embodiments, a part of the light collection layer is further extended into the color filter.

In some embodiments, the light collection layer is in the shape of a rectangle, taper, curve, or polygon.

In some embodiments, the width of the surface which is in contact with the color filter of the light collection layer is defined as the greatest width.

In some embodiments, the greatest width of the light collection layer is less than half the width of the color filter.

In some embodiments, the light collection layer is tapered, and the width of the light collection layer reduces gradually in the direction away from the color filter.

In some embodiments, the light collection layer is curved, and the width of the light collection layer reduces gradually in the direction away from the color filter.

In some embodiments, the light collection layer is a polygon, and the width of the light collection layer reduces stepwise in the direction away from the color filter.

In some embodiments, the light collection layer comprises a first rectangle and a second rectangle which is vertical to the first rectangle, and the first rectangle is in contact with the color filter.

In some embodiments, the optical element further comprises an oxide layer which covers the metal grid.

In some embodiments, the optical element further comprises an anti-reflection layer formed on the second organic layer.

In some embodiments, the refractive index of the light collection layer is greater than that of the anti-reflection layer.

In accordance with one embodiment of the invention, a method for fabricating an optical element is provided. The fabrication method includes the following steps. A substrate is provided. A plurality of metal grids are formed on the substrate. A patterned first organic layer is formed on the metal grids. A color filter is formed on the substrate. The color filter is surrounded by the patterned first organic layer. A patterned second organic layer is formed to cover the patterned first organic layer and a first part of the color filter. A light collection layer is formed on a second part of the color filter uncovered by the patterned second organic layer. The light collection layer is surrounded by the patterned second organic layer. The refractive index of the light collection layer is greater than that of the patterned second organic layer.

In some embodiments, an anti-reflection layer is further formed on the patterned second organic layer and the light collection layer.

In the present invention, a specific high-refractive-index (high-n) light collection layer (ex. n=1.6-1.9) is disposed above color filters. The refractive index of the light collection layer is higher than that of adjacent materials. By disposing the light collection layer, a QE peak of a blue (B) color filter is thus significantly improved, for example, to about 3.1%. The present optical element with the light collection layer also maintains low cross-talk between the color filters and provides QE peaks of a red (R) color filter and a green (G) color filter which are similar to those of the optical elements with composite metal grid (CMG)-type structures and wave guide color filter (WGCF)-type structures. In addition, the light collection layer can be disposed in single or multiple pixels in accordance with the demands of products. The light collection layer comprises various suitable shapes, for example, rectangle, taper, curve or polygon. The width of the surface which is in contact with the color filter of the light collection layer is defined as the greatest width, and the greatest width of the light collection layer is limited, for example, less than half the width of the color filter, to prevent the light that was originally going to neighboring pixels is absorbed by the light collection layer in the current pixel.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
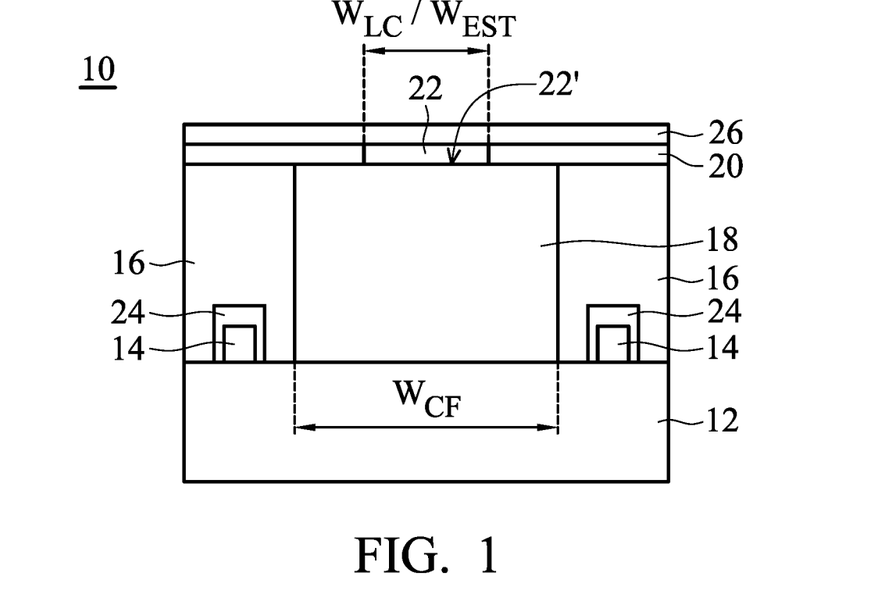
FIG. 1 is a cross-sectional view of an optical element in accordance with one embodiment of the invention.

Referring to FIG. 1, in accordance with one embodiment of the invention, an optical element 10 is provided. FIG. 1 shows a cross-sectional view of the optical element 10.

The optical element 10 includes a substrate 12, a plurality of metal grids 14, a patterned first organic layer 16, a color filter 18, a second organic layer 20 and a light collection layer 22. The plurality of metal grids 14 are formed on the substrate 12. The patterned first organic layer 16 is formed on the plurality of metal grids 14. The color filter 18 is surrounded by the patterned first organic layer 16. The second organic layer 20 is formed on the patterned first organic layer 16 and the color filter 18. The light collection layer 22 is surrounded by the second organic layer 20 and corresponds to the color filter 18. Specifically, the refractive index of the light collection layer 22 is greater than that of the second organic layer 20.

In some embodiments, the patterned first organic layer 16 has a refractive index which is in a range from about 1.2 to about 1.45.

In some embodiments, the color filter 18 is a blue (B) color filter.

In some embodiments, the color filter 18 comprises a red (R) color filter, a green (G) color filter or a blue (B) color filter.

In some embodiments, the light collection layer 22 is located over one kind of color filter, for example blue (B) color filters.

In some embodiments, the light collection layer 22 is located over at least two kinds of color filters, for example blue (B) color filters and red (R) color filters, or blue (B) color filters and green (G) color filters.

In some embodiments, the light collection layer 22 is located over all kinds of color filters, for example red (R) color filters, green (G) color filters and blue (B) color filters.

In some embodiments, the second organic layer 20 is a transparent planarization layer.

In some embodiments, the refractive index of the light collection layer 22 is greater than that of the color filter 18.

In some embodiments, the refractive index of the light collection layer 22 is in a range from about 1.6 to about 1.9.

In FIG. 1, the light collection layer 22 is exposed from the second organic layer 20, and the light collection layer 22 is in the shape of a rectangle.

In FIG. 1, the width "$W_{LC}$" of the surface 22' which is in contact with the color filter 18 of the light collection layer 22 is defined as the greatest width "$W_{EST}$".

In some embodiments, the greatest width "$W_{EST}$" of the light collection layer 22 is less than half the width "$W_{CF}$" of the color filter 18.

In some embodiments, the optical element 10 further comprises an oxide layer 24 which covers the metal grid 14. The oxide layer 24 is used as a protection layer for the metal grid 14.

In some embodiments, the optical element 10 further comprises an anti-reflection layer 26 formed on the second organic layer 20.

In some embodiments, the refractive index of the light collection layer 22 is greater than that of the anti-reflection layer 26.

Figure 2:
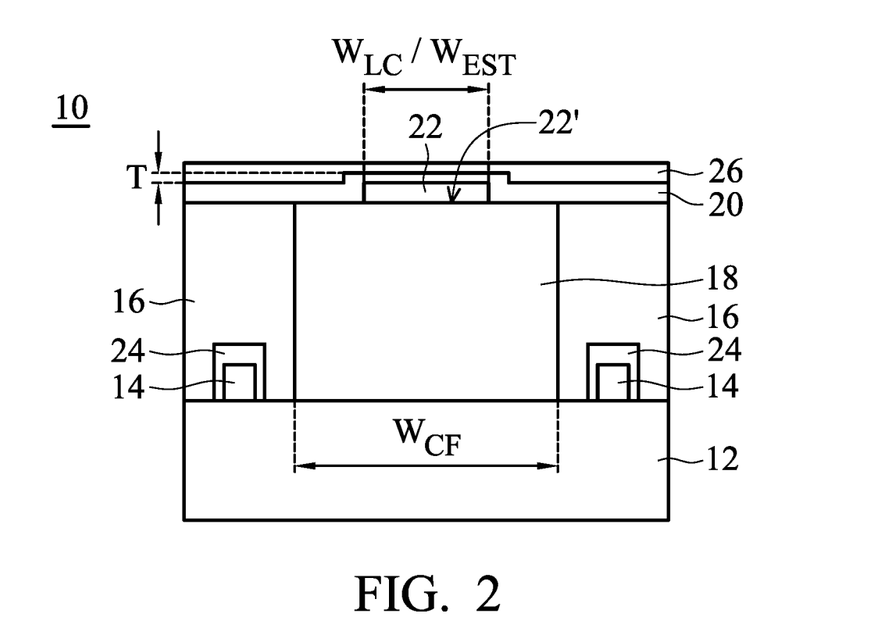
FIG. 2 is a cross-sectional view of an optical element in accordance with one embodiment of the invention.

Referring to FIG. 2, in accordance with one embodiment of the invention, an optical element 10 is provided. FIG. 2 shows a cross-sectional view of the optical element 10.

The optical element 10 includes a substrate 12, a plurality of metal grids 14, a patterned first organic layer 16, a color filter 18, a second organic layer 20 and a light collection layer 22. The plurality of metal grids 14 are formed on the substrate 12. The patterned first organic layer 16 is formed on the plurality of metal grids 14. The color filter 18 is surrounded by the patterned first organic layer 16. The second organic layer 20 is formed on the patterned first organic layer 16 and the color filter 18. The light collection layer 22 is surrounded by the second organic layer 20 and corresponds to the color filter 18. Specifically, the refractive index of the light collection layer 22 is greater than that of the second organic layer 20.

In some embodiments, the patterned first organic layer 16 has a refractive index which is in a range from about 1.2 to about 1.45.

In some embodiments, the color filter 18 is a blue (B) color filter.

In some embodiments, the color filter 18 comprises a red (R) color filter, a green (G) color filter or a blue (B) color filter.

In some embodiments, the light collection layer 22 is located over one kind of color filter, for example blue (B) color filters.

In some embodiments, the light collection layer 22 is located over at least two kinds of color filters, for example blue (B) color filters and red (R) color filters, or blue (B) color filters and green (G) color filters.

In some embodiments, the light collection layer 22 is located over all kinds of color filters, for example red (R) color filters, green (G) color filters and blue (B) color filters.

In some embodiments, the second organic layer 20 is a transparent planarization layer.

In some embodiments, the refractive index of the light collection layer 22 is greater than that of the color filter 18.

In some embodiments, the refractive index of the light collection layer 22 is in a range from about 1.6 to about 1.9.

In FIG. 2, the light collection layer 22 is further covered by the second organic layer 20, and the second organic layer 20 above the light collection layer 22 has a thickness "T" which is less than or equal to about 50 nm.

In FIG. 2, the light collection layer 22 is rectangular, and the width "$W_{LC}$" of the surface 22' which is in contact with the color filter 18 of the light collection layer 22 is defined as the greatest width "$W_{EST}$".

In some embodiments, the greatest width "$W_{EST}$" of the light collection layer 22 is less than half the width "$W_{CF}$" of the color filter 18.

In some embodiments, the optical element 10 further comprises an oxide layer 24 which covers the metal grid 14. The oxide layer 24 is used as a protection layer for the metal grid 14.

In some embodiments, the optical element 10 further comprises an anti-reflection layer 26 formed on the second organic layer 20.

In some embodiments, the refractive index of the light collection layer 22 is greater than that of the anti-reflection layer 26.

Figure 3:
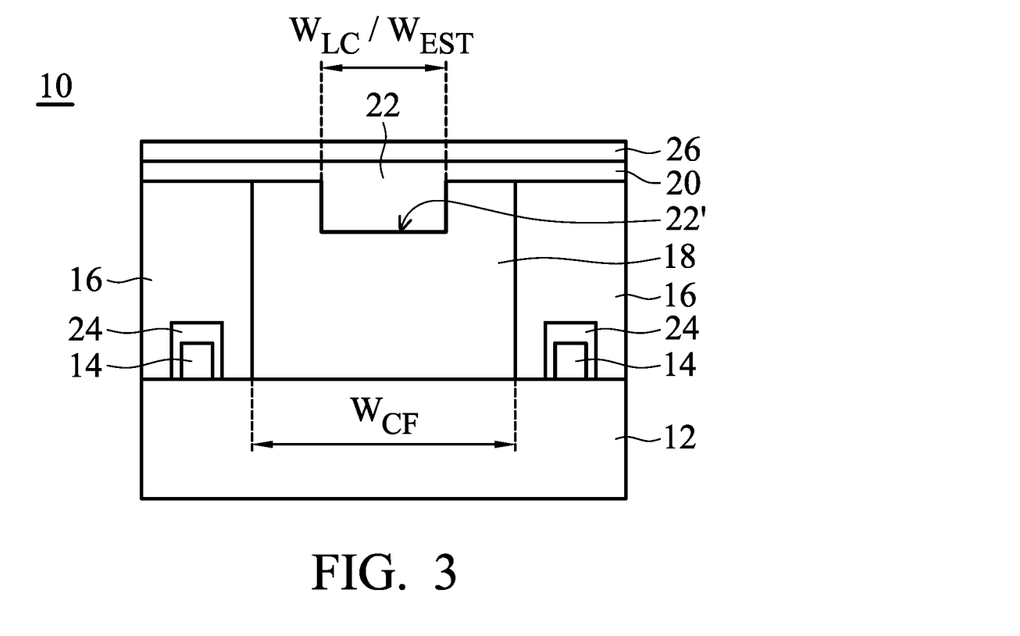
FIG. 3 is a cross-sectional view of an optical element in accordance with one embodiment of the invention.

Referring to FIG. 3, in accordance with one embodiment of the invention, an optical element 10 is provided. FIG. 3 shows a cross-sectional view of the optical element 10.

The optical element 10 includes a substrate 12, a plurality of metal grids 14, a patterned first organic layer 16, a color filter 18, a second organic layer 20 and a light collection layer 22. The plurality of metal grids 14 are formed on the substrate 12. The patterned first organic layer 16 is formed on the plurality of metal grids 14. The color filter 18 is surrounded by the patterned first organic layer 16. The second organic layer 20 is formed on the patterned first organic layer 16 and the color filter 18. The light collection layer 22 is surrounded by the second organic layer 20 and corresponds to the color filter 18. Specifically, the refractive index of the light collection layer 22 is greater than that of the second organic layer 20.

In some embodiments, the patterned first organic layer 16 has a refractive index which is in a range from about 1.2 to about 1.45.

In some embodiments, the color filter 18 is a blue (B) color filter.

In some embodiments, the color filter 18 comprises a red (R) color filter, a green (G) color filter or a blue (B) color filter.

In some embodiments, the light collection layer 22 is located over one kind of color filter, for example blue (B) color filters.

In some embodiments, the light collection layer 22 is located over at least two kinds of color filters, for example blue (B) color filters and red (R) color filters, or blue (B) color filters and green (G) color filters.

In some embodiments, the light collection layer 22 is located over all kinds of color filters, for example red (R) color filters, green (G) color filters and blue (B) color filters.

In some embodiments, the second organic layer 20 is a transparent planarization layer.

In some embodiments, the refractive index of the light collection layer 22 is greater than that of the color filter 18.

In some embodiments, the refractive index of the light collection layer 22 is in a range from about 1.6 to about 1.9.

In FIG. 3, a part of the light collection layer 22 is further extended into the color filter 18, and the light collection layer 22 is rectangular.

In FIG. 3, the width "$W_{LC}$" of the surface 22' which is in contact with the color filter 18 of the light collection layer 22 is defined as the greatest width "$W_{EST}$".

In some embodiments, the greatest width "$W_{EST}$" of the light collection layer 22 is less than half the width "$W_{CF}$" of the color filter 18.

In some embodiments, the optical element 10 further comprises an oxide layer 24 which covers the metal grid 14. The oxide layer 24 is used as a protection layer for the metal grid 14.

In some embodiments, the optical element 10 further comprises an anti-reflection layer 26 formed on the second organic layer 20.

In some embodiments, the refractive index of the light collection layer 22 is greater than that of the anti-reflection layer 26.

Figure 4:
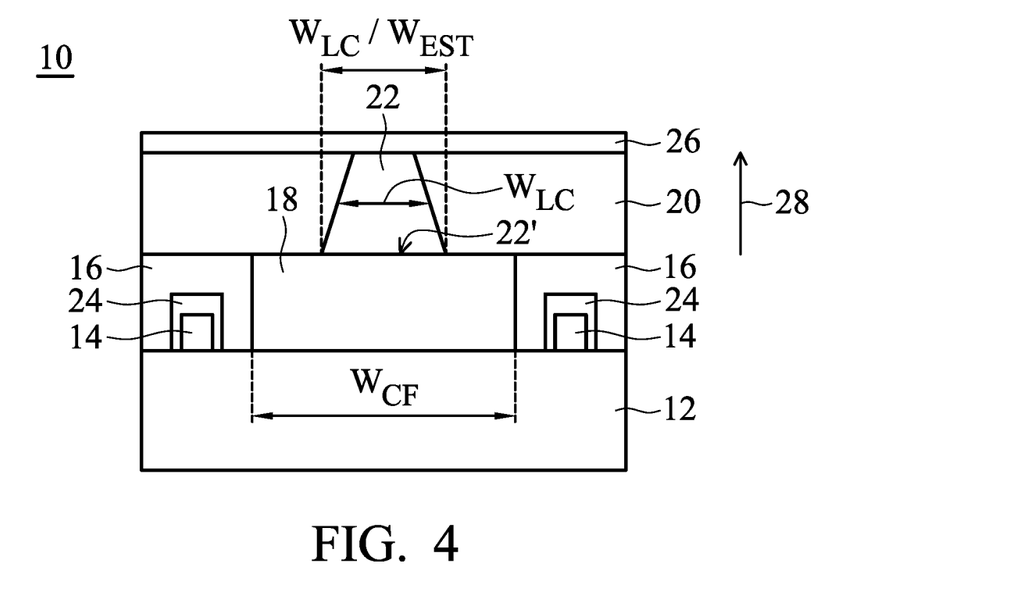
FIG. 4 is a cross-sectional view of an optical element in accordance with one embodiment of the invention.

Referring to FIG. 4, in accordance with one embodiment of the invention, an optical element 10 is provided. FIG. 4 shows a cross-sectional view of the optical element 10.

The optical element 10 includes a substrate 12, a plurality of metal grids 14, a patterned first organic layer 16, a color filter 18, a second organic layer 20 and a light collection layer 22. The plurality of metal grids 14 are formed on the substrate 12. The patterned first organic layer 16 is formed on the plurality of metal grids 14. The color filter 18 is surrounded by the patterned first organic layer 16. The second organic layer 20 is formed on the patterned first organic layer 16 and the color filter 18. The light collection layer 22 is surrounded by the second organic layer 20 and corresponds to the color filter 18. Specifically, the refractive index of the light collection layer 22 is greater than that of the second organic layer 20.

In some embodiments, the patterned first organic layer 16 has a refractive index which is in a range from about 1.2 to about 1.45.

In some embodiments, the color filter 18 is a blue (B) color filter.

In some embodiments, the color filter 18 comprises a red (R) color filter, a green (G) color filter or a blue (B) color filter.

In some embodiments, the light collection layer 22 is located over one kind of color filter, for example blue (B) color filters.

In some embodiments, the light collection layer 22 is located over at least two kinds of color filters, for example blue (B) color filters and red (R) color filters, or blue (B) color filters and green (G) color filters.

In some embodiments, the light collection layer 22 is located over all kinds of color filters, for example red (R) color filters, green (G) color filters and blue (B) color filters.

In some embodiments, the second organic layer 20 is a transparent planarization layer.

In some embodiments, the refractive index of the light collection layer 22 is greater than that of the color filter 18.

In some embodiments, the refractive index of the light collection layer 22 is in a range from about 1.6 to about 1.9.

In FIG. 4, the light collection layer 22 is exposed from the second organic layer 20, and the light collection layer 22 is tapered.

In FIG. 4, the width "$W_{LC}$" of the light collection layer 22 reduces gradually in a direction 28 away from the color filter 18.

In FIG. 4, the width "$W_{LC}$" of the surface 22' which is in contact with the color filter 18 of the light collection layer 22 is defined as the greatest width "$W_{EST}$".

In some embodiments, the greatest width "$W_{EST}$" of the light collection layer 22 is less than half the width "$W_{CF}$" of the color filter 18.

In some embodiments, the optical element 10 further comprises an oxide layer 24 which covers the metal grid 14. The oxide layer 24 is used as a protection layer for the metal grid 14.

In some embodiments, the optical element 10 further comprises an anti-reflection layer 26 formed on the second organic layer 20.

In some embodiments, the refractive index of the light collection layer 22 is greater than that of the anti-reflection layer 26.

Figure 5:
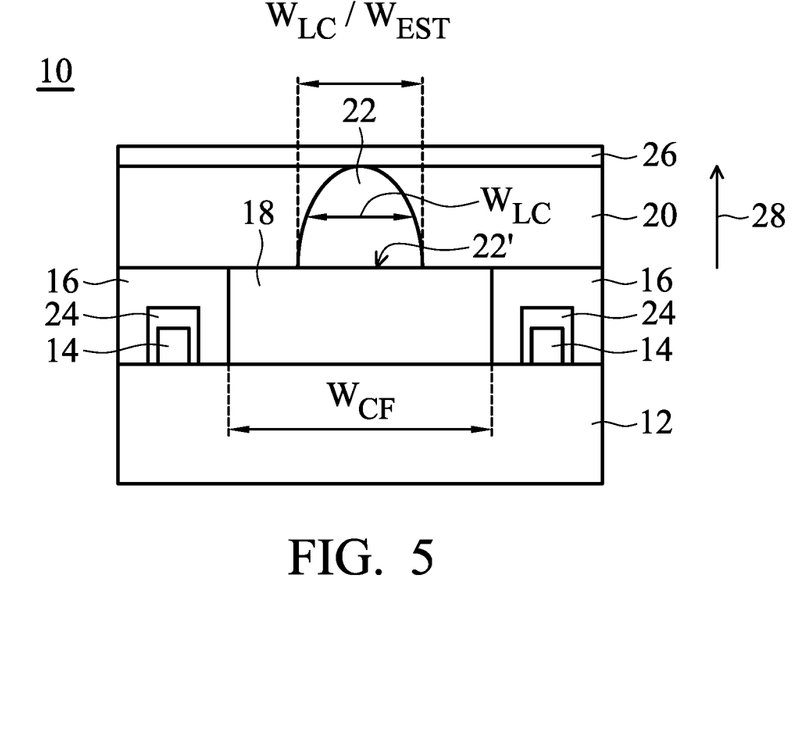
FIG. 5 is a cross-sectional view of an optical element in accordance with one embodiment of the invention.

Referring to FIG. 5, in accordance with one embodiment of the invention, an optical element 10 is provided. FIG. 5 shows a cross-sectional view of the optical element 10.

The optical element 10 includes a substrate 12, a plurality of metal grids 14, a patterned first organic layer 16, a color filter 18, a second organic layer 20 and a light collection layer 22. The plurality of metal grids 14 are formed on the substrate 12. The patterned first organic layer 16 is formed on the plurality of metal grids 14. The color filter 18 is surrounded by the patterned first organic layer 16. The second organic layer 20 is formed on the patterned first organic layer 16 and the color filter 18. The light collection layer 22 is surrounded by the second organic layer 20 and corresponds to the color filter 18. Specifically, the refractive index of the light collection layer 22 is greater than that of the second organic layer 20.

In some embodiments, the patterned first organic layer 16 has a refractive index which is in a range from about 1.2 to about 1.45.

In some embodiments, the color filter 18 is a blue (B) color filter.

In some embodiments, the color filter 18 comprises a red (R) color filter, a green (G) color filter or a blue (B) color filter.

In some embodiments, the light collection layer 22 is located over one kind of color filter, for example blue (B) color filters.

In some embodiments, the light collection layer 22 is located over at least two kinds of color filters, for example blue (B) color filters and red (R) color filters, or blue (B) color filters and green (G) color filters.

In some embodiments, the light collection layer 22 is located over all kinds of color filters, for example red (R) color filters, green (G) color filters and blue (B) color filters.

In some embodiments, the second organic layer 20 is a transparent planarization layer.

In some embodiments, the refractive index of the light collection layer 22 is greater than that of the color filter 18.

In some embodiments, the refractive index of the light collection layer 22 is in a range from about 1.6 to about 1.9.

In FIG. 5, the light collection layer 22 is exposed from the second organic layer 20, and the light collection layer 22 is curved.

In FIG. 5, the width "$W_{LC}$" of the light collection layer 22 reduces gradually in a direction 28 away from the color filter 18.

In FIG. 5, the width "$W_{LC}$" of the surface 22' which is in contact with the color filter 18 of the light collection layer 22 is defined as the greatest width "$W_{EST}$".

In some embodiments, the greatest width "$W_{EST}$" of the light collection layer 22 is less than half the width "$W_{CF}$" of the color filter 18.

In some embodiments, the optical element 10 further comprises an oxide layer 24 which covers the metal grid 14. The oxide layer 24 is used as a protection layer for the metal grid 14.

In some embodiments, the optical element 10 further comprises an anti-reflection layer 26 formed on the second organic layer 20.

In some embodiments, the refractive index of the light collection layer 22 is greater than that of the anti-reflection layer 26.

Figure 6:
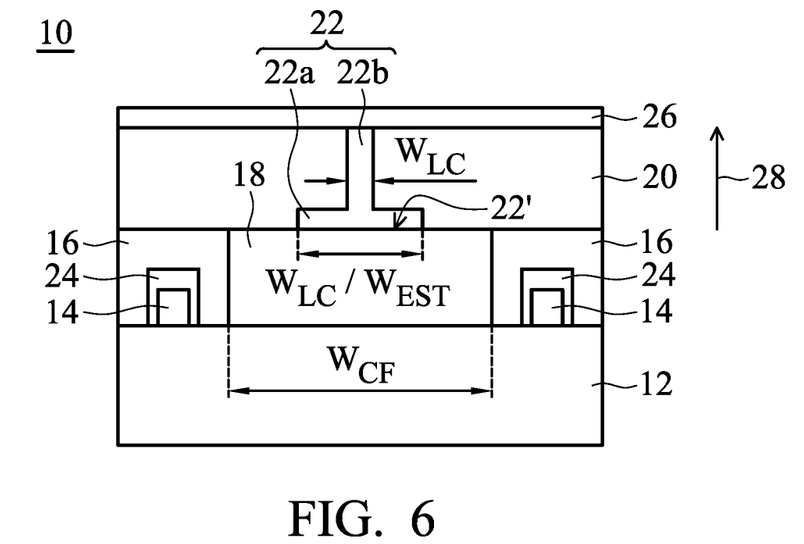
FIG. 6 is a cross-sectional view of an optical element in accordance with one embodiment of the invention.

Referring to FIG. 6, in accordance with one embodiment of the invention, an optical element 10 is provided. FIG. 6 shows a cross-sectional view of the optical element 10.

The optical element 10 includes a substrate 12, a plurality of metal grids 14, a patterned first organic layer 16, a color filter 18, a second organic layer 20 and a light collection layer 22. The plurality of metal grids 14 are formed on the substrate 12. The patterned first organic layer 16 is formed on the plurality of metal grids 14. The color filter 18 is surrounded by the patterned first organic layer 16. The second organic layer 20 is formed on the patterned first organic layer 16 and the color filter 18. The light collection layer 22 is surrounded by the second organic layer 20 and corresponds to the color filter 18. Specifically, the refractive index of the light collection layer 22 is greater than that of the second organic layer 20.

In some embodiments, the patterned first organic layer 16 has a refractive index which is in a range from about 1.2 to about 1.45.

In some embodiments, the color filter 18 is a blue (B) color filter.

In some embodiments, the color filter 18 comprises a red (R) color filter, a green (G) color filter or a blue (B) color filter.

In some embodiments, the light collection layer 22 is located over one kind of color filter, for example blue (B) color filters.

In some embodiments, the light collection layer 22 is located over at least two kinds of color filters, for example blue (B) color filters and red (R) color filters, or blue (B) color filters and green (G) color filters.

In some embodiments, the light collection layer 22 is located over all kinds of color filters, for example red (R) color filters, green (G) color filters and blue (B) color filters.

In some embodiments, the second organic layer 20 is a transparent planarization layer.

In some embodiments, the refractive index of the light collection layer 22 is greater than that of the color filter 18.

In some embodiments, the refractive index of the light collection layer 22 is in a range from about 1.6 to about 1.9.

In FIG. 6, the light collection layer 22 is exposed from the second organic layer 20, and the light collection layer 22 is in the shape of a polygon.

In FIG. 6, the light collection layer 22 comprises a first rectangle 22a and a second rectangle 22b which is vertical to the first rectangle 22a, and the first rectangle 22a is in contact with the color filter 18.

In FIG. 6, the width "$W_{LC}$" of the light collection layer 22 reduces stepwise in a direction 28 away from the color filter 18.

In FIG. 6, the width "$W_{LC}$" of the surface 22' which is in contact with the color filter 18 of the light collection layer 22 is defined as the greatest width "$W_{EST}$".

In some embodiments, the greatest width "$W_{EST}$" of the light collection layer 22 is less than half the width "$W_{CF}$" of the color filter 18.

In some embodiments, the optical element 10 further comprises an oxide layer 24 which covers the metal grid 14. The oxide layer 24 is used as a protection layer for the metal grid 14.

In some embodiments, the optical element 10 further comprises an anti-reflection layer 26 formed on the second organic layer 20.

In some embodiments, the refractive index of the light collection layer 22 is greater than that of the anti-reflection layer 26.

Referring to FIGS. 7A-7J, in accordance with one embodiment of the invention, a method for fabricating an optical element is provided. FIGS. 7A-7J show cross-sectional views of the method for fabricating an optical element.

Figure 7A:
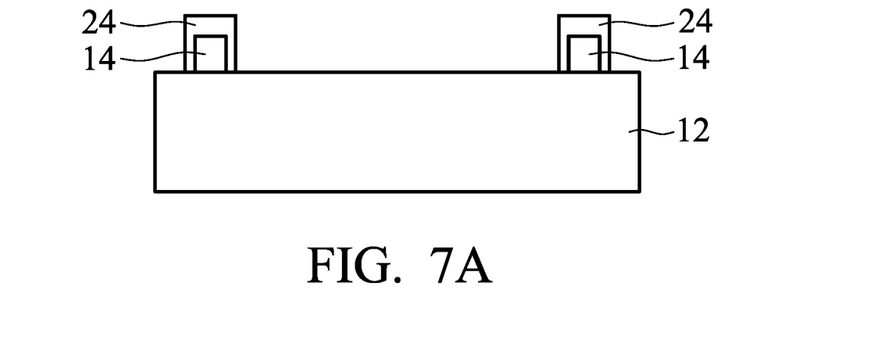
FIGS. 7A-7J are cross-sectional views of a method for fabricating an optical element in accordance with one embodiment of the invention.

Referring to FIG. 7A, a substrate 12 is provided. A plurality of metal grids 14 are formed on the substrate 12. A plurality of oxide layers 24 are formed to cover the metal grids 14. The oxide layers 24 are used as protection layers for the metal grids 14.

Figure 7B:
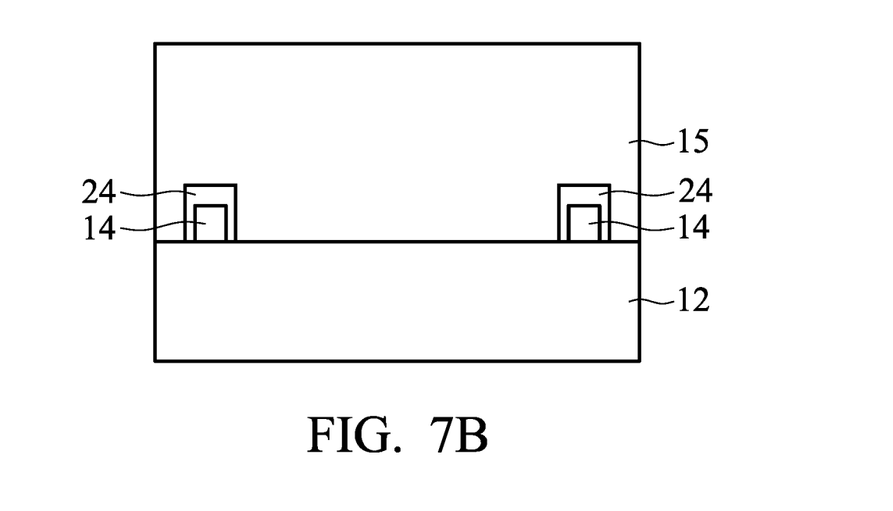

Referring to FIG. 7B, a first organic layer 15 is formed on the metal grids 14 and the substrate 12.

In some embodiments, the first organic layer 15 has a refractive index which is in a range from about 1.2 to about 1.45.

Figure 7C:
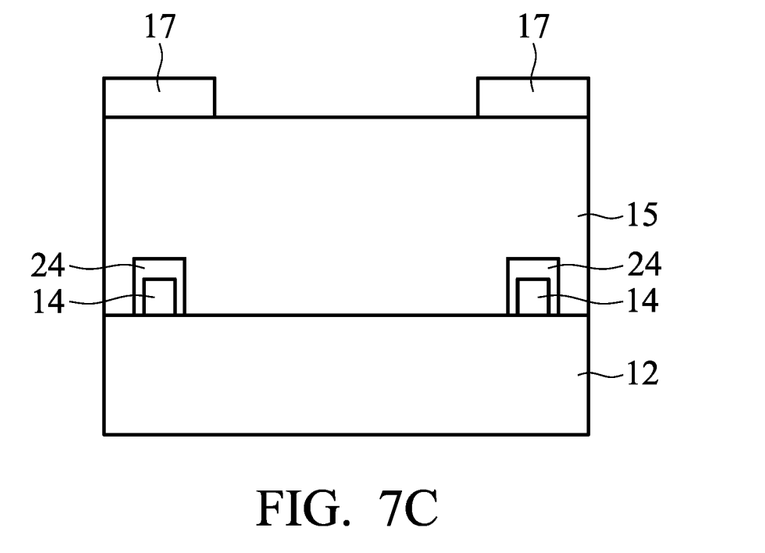

Referring to FIG. 7C, a patterned photoresist layer 17 is formed on the first organic layer 15.

Figure 7D:
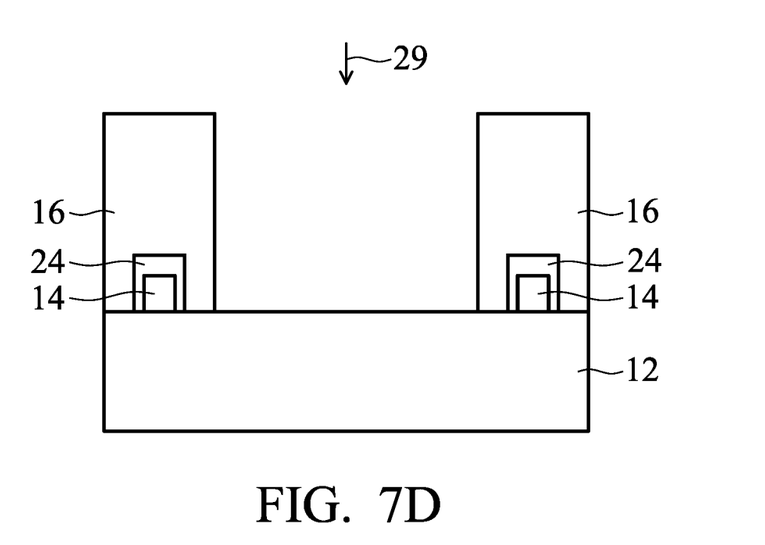

Referring to FIG. 7D, a photolithography process 29 is performed on the first organic layer 15 using the patterned photoresist layer 17 as a mask to form a patterned first organic layer 16 which covers the metal grids 14. The patterned photoresist layer 17 is then removed.

Figure 7E:
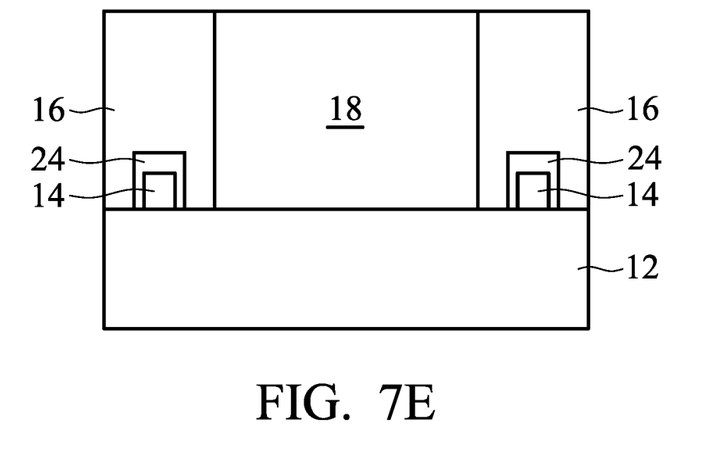

Referring to FIG. 7E, a color filter 18 is formed on the substrate 12. The color filter 18 is surrounded by the patterned first organic layer 16.

In some embodiments, the color filter 18 is a blue (B) color filter.

In some embodiments, the color filter 18 comprises a red (R) color filter, a green (G) color filter or a blue (B) color filter.

Figure 7F:
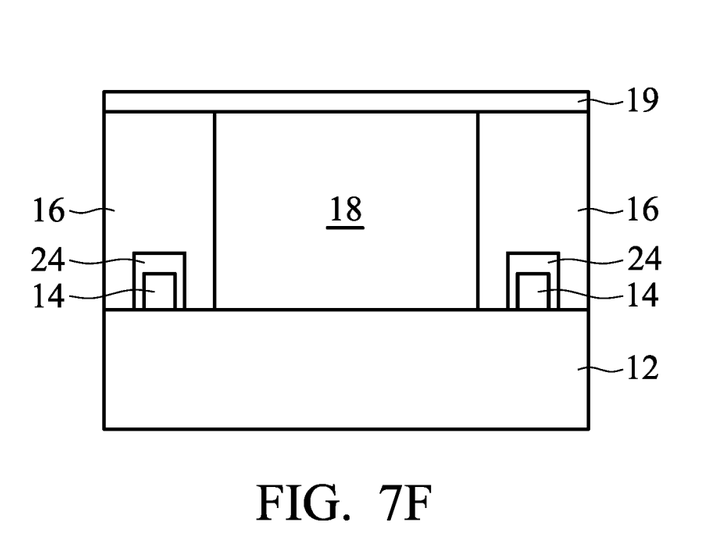

Referring to FIG. 7F, a second organic layer 19 is formed on the patterned first organic layer 16 and the color filter 18.

In some embodiments, the second organic layer 19 is a transparent planarization layer.

Figure 7G:
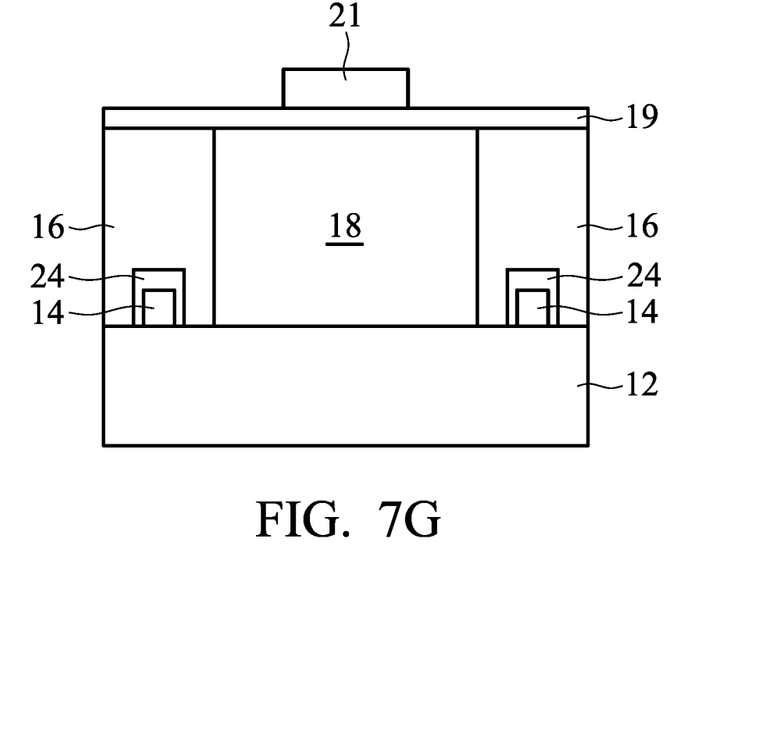

Referring to FIG. 7G, a patterned photoresist layer 21 is formed on the second organic layer 19.

Figure 7H:
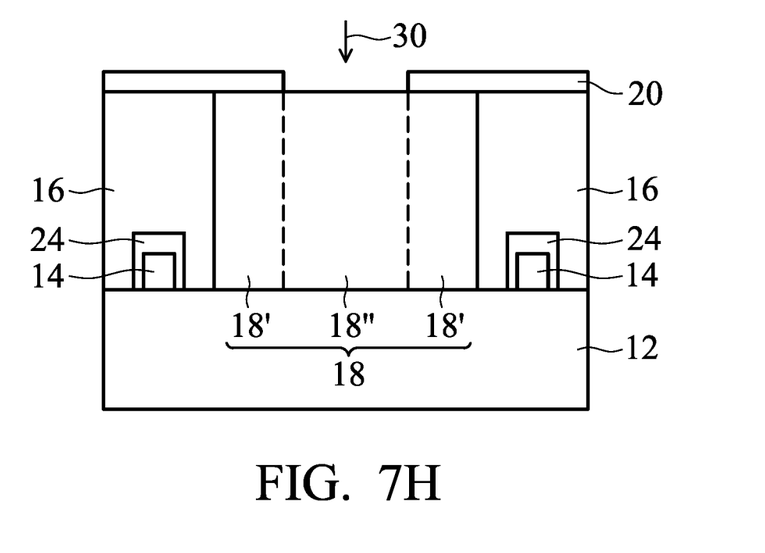

Referring to FIG. 7H, a photolithography process 30 is performed on the second organic layer 19 using the patterned photoresist layer 21 as a mask to form a patterned second organic layer 20 which covers the patterned first organic layer 16 and the first part 18' of the color filter 18. That is, the first part 18' of the color filter 18 is covered by the patterned second organic layer 20, exposing the second part 18" of the color filter 18 from the patterned second organic layer 20. The patterned photoresist layer 21 is then removed.

Figure 7I:
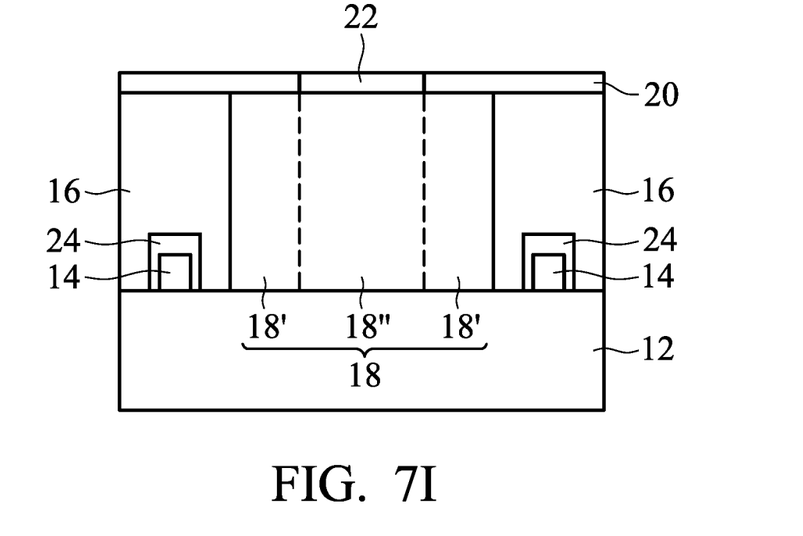

Referring to FIG. 7I, a light collection layer 22 is formed on the second part 18" of the color filter 18. The second part 18" of the color filter 18 is uncovered by the patterned second organic layer 20. The light collection layer 22 is surrounded by the patterned second organic layer 20.

In some embodiments, the light collection layer 22 is located over one kind of color filter, for example blue (B) color filters.

In some embodiments, the light collection layer 22 is located over at least two kinds of color filters, for example blue (B) color filters and red (R) color filters, or blue (B) color filters and green (G) color filters.

In some embodiments, the light collection layer 22 is located over all kinds of color filters, for example red (R) color filters, green (G) color filters and blue (B) color filters.

In some embodiments, the refractive index of the light collection layer 22 is greater than that of the patterned second organic layer 20.

In some embodiments, the refractive index of the light collection layer 22 is greater than that of the color filter 18.

In some embodiments, the refractive index of the light collection layer 22 is in a range from about 1.6 to about 1.9.

In FIG. 7I, the light collection layer 22 is exposed from the patterned second organic layer 20, and the light collection layer 22 is in the shape of a rectangle.

The related dimensions of the light collection layer 22 are shown in FIG. 1.

The fabrication processes of the light collection layer 22 with other shapes, for example, tapers, curves or polygons, are similar to the fabrication processes shown in FIGS. 7A-7I.

Figure 7J:
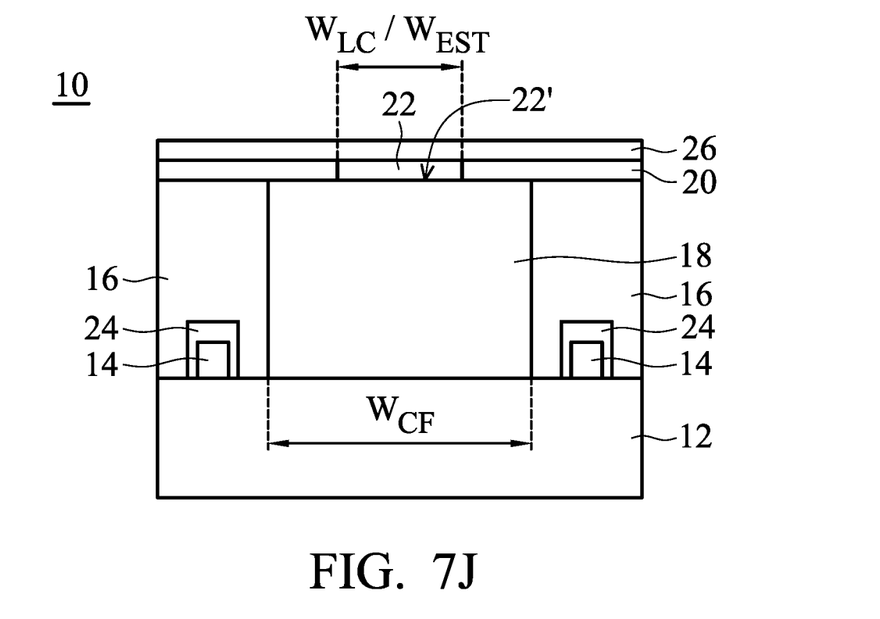

Referring to FIG. 7J, an anti-reflection layer 26 is formed on the patterned second organic layer 20 and the light collection layer 22.

In some embodiments, the refractive index of the light collection layer 22 is greater than that of the anti-reflection layer 26.

Example 1

QE Spectrum Improvement of the Optical Element

Figure 8:
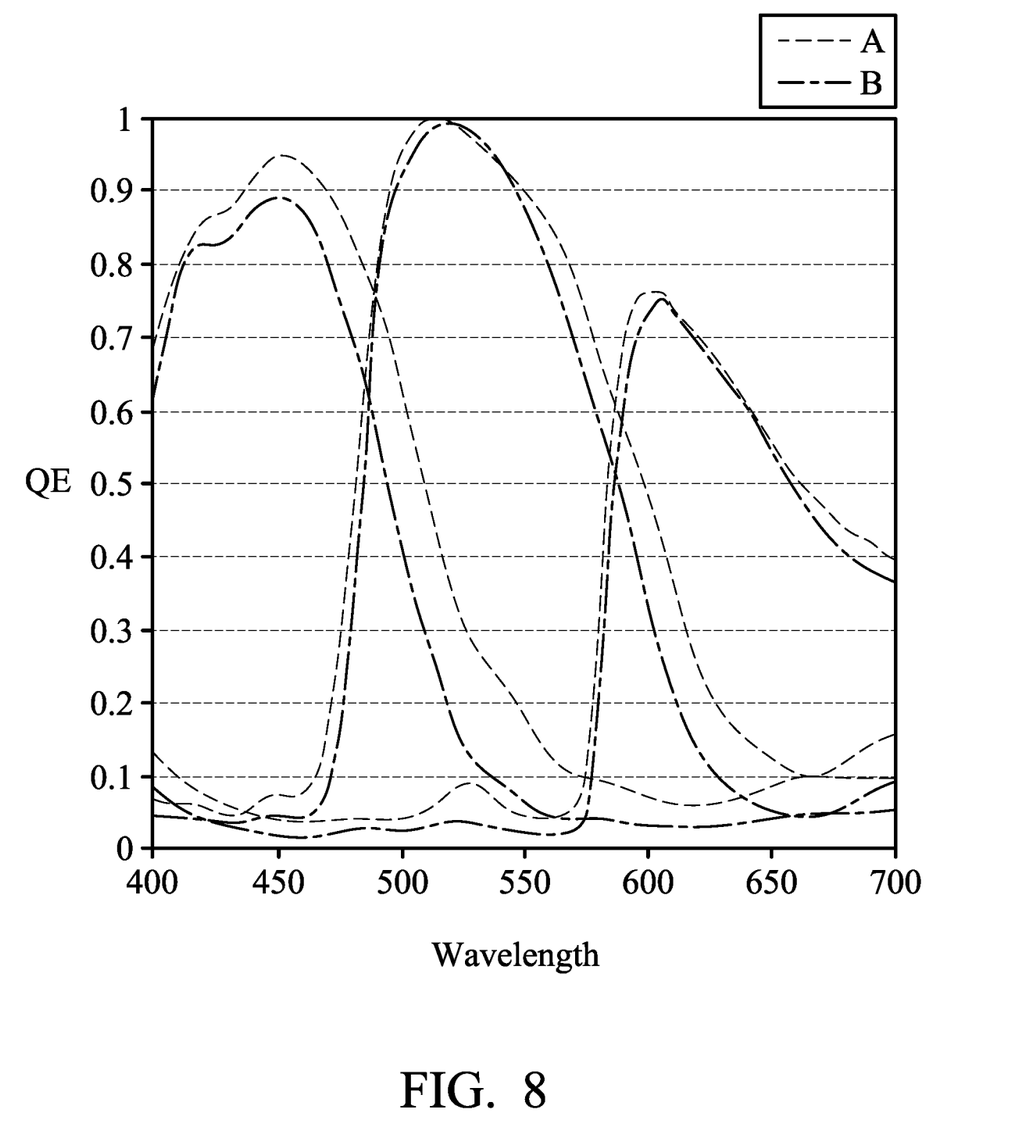
FIG. 8 shows a QE spectrum of a conventional optical element.
Figure 9:
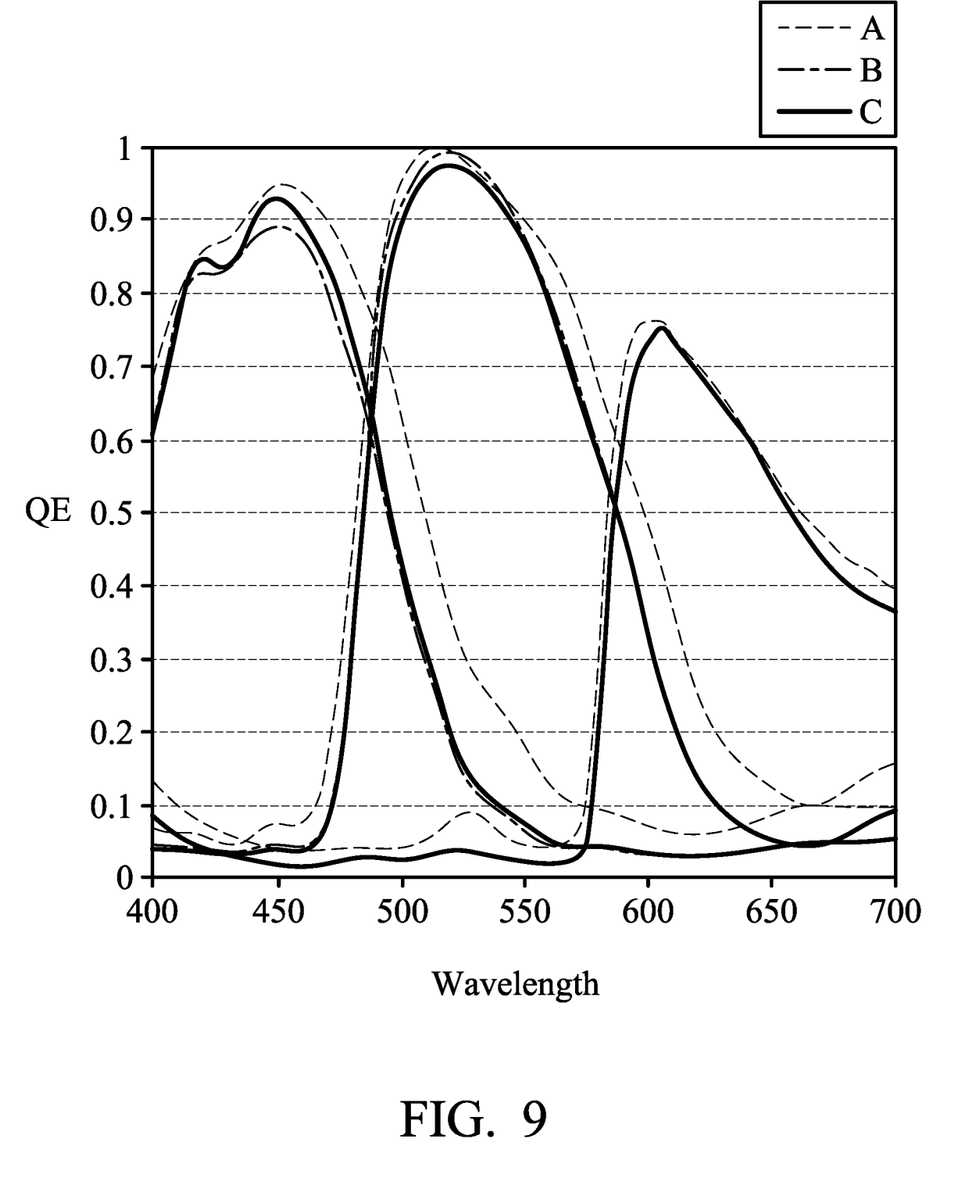
FIG. 9 shows a QE spectrum of an optical element in accordance with one embodiment of the invention.

In this example, improvement of a QE spectrum, especially for a blue (B) color filter, is acknowledged by disposing a specific light collection layer in an optical element. Referring to FIG. 8, the curve "A" shows a QE spectrum (R/G/B) of an optical element with a composite metal grid (CMG)-type structure, and the curve "B" shows a QE spectrum (R/G/B) of an optical element with a wave guide color filter (WGCF)-type structure. Apparently, the QE peak of the blue (B) color filter of the optical element with the wave guide color filter (WGCF)-type structure is dropped. Furthermore, referring to FIG. 9, the curve "C" shows a QE spectrum (R/G/B) of an optical element with a wave guide color filter (WGCF)-type structure that includes the specific light collection layer shown in FIG. 1. The QE spectrum (curve "C") built by the optical element with the wave guide color filter (WGCF)-type structure that includes the specific light collection layer shown in FIG. 1 shows that the QE peak of the blue (B) color filter of the optical element is a significant improvement of about 3.1% over curve "B". In addition, the QE spectrum (curve "C") also shows that the low cross-talk between the color filters is maintained.

In the present invention, a specific high-refractive-index (high-n) light collection layer (ex. n=1.6-1.9) is disposed above color filters. The refractive index of the light collection layer is higher than that of adjacent materials. By disposing the light collection layer, a QE peak of a blue (B) color filter is thus significantly improved, for example, to about 3.1%. The present optical element with the light collection layer also maintains low cross-talk between the color filters and provides QE peaks of a red (R) color filter and a green (G) color filter which are similar to those of the optical elements with composite metal grid (CMG)-type structures and wave guide color filter (WGCF)-type structures. In addition, the light collection layer can be disposed in single or multiple pixels in accordance with the demands of products. The light collection layer comprises various suitable shapes, for example, rectangle, taper, curve or polygon. The width of the surface which is in contact with the color filter of the light collection layer is defined as the greatest width, and the greatest width of the light collection layer is limited, for example, less than half the width of the color filter, to prevent the light that was originally going to neighboring pixels is absorbed by the light collection layer in the current pixel.

While the invention has been described by way of example and in terms of preferred embodiment, it is to be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An optical element, comprising:
   a substrate;
   a plurality of metal grids formed on the substrate;
   a patterned first organic layer formed on the plurality of metal grids;
   a color filter having a width and a refractive index surrounded by the patterned first organic layer;
   a second organic layer having a refractive index formed on the patterned first organic layer and the color filter; and
   a light collection layer having a width, a surface and a refractive index surrounded by the second organic layer and corresponding to the color filter, wherein the refractive index of the light collection layer is greater than that of the second organic layer.

2. The optical element as claimed in claim 1, wherein the patterned first organic layer has a refractive index which is in a range from about 1.2 to about 1.45.

3. The optical element as claimed in claim 1, wherein the color filter is a blue color filter.

4. The optical element as claimed in claim 1, wherein the color filter comprises a red color filter, a green color filter or a blue color filter.

5. The optical element as claimed in claim 1, wherein the refractive index of the light collection layer is greater than that of the color filter.

6. The optical element as claimed in claim 1, wherein the refractive index of the light collection layer is in a range from about 1.6 to about 1.9.

7. The optical element as claimed in claim 1, wherein the light collection layer is exposed from the second organic layer.

8. The optical element as claimed in claim 1, wherein the light collection layer is further covered by the second organic layer, and the second organic layer above the light collection layer has a thickness which is less than or equal to about 50 nm.

9. The optical element as claimed in claim 1, wherein a part of the light collection layer is further extended into the color filter.

10. The optical element as claimed in claim 1, wherein the light collection layer has a shape that is a rectangle, taper, curve or polygon.

11. The optical element as claimed in claim 10, wherein the width of the surface which is in contact with the color filter of the light collection layer is defined as a greatest width.

12. The optical element as claimed in claim 11, wherein the greatest width of the light collection layer is less than half the width of the color filter.

13. The optical element as claimed in claim 11, wherein the light collection layer is tapered, and the width of the light collection layer reduces gradually in a direction away from the color filter.

14. The optical element as claimed in claim 11, wherein the light collection layer is curved, and the width of the light collection layer reduces gradually in a direction away from the color filter.

15. The optical element as claimed in claim 11, wherein the light collection layer is a polygon, and the width of the light collection layer reduces stepwise in a direction away from the color filter.

16. The optical element as claimed in claim 15, wherein the light collection layer comprises a first rectangle and a second rectangle which is vertical to the first rectangle, and the first rectangle is in contact with the color filter.

17. The optical element as claimed in claim 1, further comprising an oxide layer covering the metal grid.

18. The optical element as claimed in claim 1, further comprising an anti-reflection layer having a refractive index formed on the second organic layer, and the refractive index of the light collection layer is greater than that of the anti-reflection layer.

19. A method for fabricating an optical element, comprising:
   providing a substrate;
   forming a plurality of metal grids on the substrate;
   forming a patterned first organic layer on the plurality of metal grids;
   forming a color filter on the substrate, the color filter being surrounded by the patterned first organic layer;
   forming a patterned second organic layer having a refractive index to cover the patterned first organic layer and a first part of the color filter; and
   forming a light collection layer having a refractive index on a second part of the color filter uncovered by the patterned second organic layer, the light collection layer being surrounded by the patterned second organic layer, wherein the refractive index of the light collection layer is greater than that of the patterned second organic layer.

20. The method for fabricating an optical element as claimed in claim 19, further comprising forming an anti-reflection layer on the patterned second organic layer and the light collection layer.

* * * * *